United States Patent [19]

Murakami et al.

[11] 4,378,384

[45] Mar. 29, 1983

[54] PROCESS FOR PRODUCING PRINTED CIRCUIT BOARD BY ELECTROLESS PLATING

[75] Inventors: Kanji Murakami, Mito; Mineo Kawamoto, Hitachi; Yutaka Itoh, Takahagi; Youichi Matsuda; Motoyo Wajima, both of Hitachi; Shoji Kawakubo; Toyofusa Yoshimura, both of Nakamachi, all of Japan

[73] Assignee: Hitachi, Ltd., Tokyo, Japan

[21] Appl. No.: 297,565

[22] Filed: Aug. 31, 1981

[30] Foreign Application Priority Data

Sep. 2, 1980 [JP] Japan ................... 55-120636

[51] Int. Cl.$^3$ ................... C23C 3/02; H05K 3/18
[52] U.S. Cl. ................... 427/97; 427/98
[58] Field of Search ................... 427/97, 98

[56] References Cited

U.S. PATENT DOCUMENTS 3,982,045 9/1976 Kukanskis ................... 427/98
4,293,592 10/1981 Morishita et al. ................... 427/98

FOREIGN PATENT DOCUMENTS 55-22841 2/1980 Japan ................... 427/98
638631 12/1978 U.S.S.R. ................... 427/98

*Primary Examiner*—John D. Smith
*Attorney, Agent, or Firm*—Antonelli, Terry & Wands

[57] ABSTRACT

A process for producing a printed circuit board which comprises forming a plating film forming adhesive layer on the whole exposed surface of an insulating board, roughening said adhesive layer surface, depositing a catalyst for electroless copper plating on said adhesive layer surface from a catalyst solution, masking the thus treated insulating board surface excepting the part where a circuit is to be formed, and then performing the electroless copper plating on the catalyst of the board to form a circuit thereon, wherein an improvement comprises treating the roughened adhesive layer surface with an alkaline solution before depositing the catalyst thereon and treating the masked insulating board with an aqueous solution containing a surfactant before performing the electroless copper plating. The above process assures a higher copper utilization and a large adhesive strength of the copper plating to the board.

20 Claims, No Drawings

PROCESS FOR PRODUCING PRINTED CIRCUIT BOARD BY ELECTROLESS PLATING

BACKGROUND OF THE INVENTION

This invention relates to a process for producing a printed circuit board forming a conductor circuit by electroless plating, and more particularly it relates to a printed circuit board producing process capable of accomplishing desired plating while maintaining the electroless plating solution in a stable state.

Hitherto, production of the printed circuit boards by electroless plating has comprised the following steps: (1) depositing an adhesive layer containing synthetic rubber on an insulating board, (2) roughening the deposited adhesive layer, (3) depositing a catalyst for electroless plating on the roughened surface, (4) masking the entire surface save the portion where the circuit is to be formed, and (5) performing electroless plating. This prior art process had some serious disadvantages such as unsatisfactory adhesiveness of plating film, which would cause swelling or peel-off of the plating film during soldering, and unstable electroless plating solution due to fall-off of the deposited catalyst, resulting in a reduced plating efficiency and copper utilization.

For improving such catalyst adhesiveness, it has been proposed to subject the roughened adhesive layer surface to an alkali treatment to remove the weak layer on the adhesive layer (Japanese Laid-Open Patent Publication No. 22841/1980), or to incorporate a surfactant treatment after masking to improve the partial plating quality (Japanese Laid-Open Patent Publication No. 109225/1976).

SUMMARY OF THE INVENTION

An object of this invention is to provide a process for producing printed circuit boards by electroless plating, which process has overcome said prior art disadvantages.

Another object of this invention is to provide the process improved in copper utilization by repeated electroless plating.

Still another object of the invention is to provide the process capable of maintaining the electroless plating solution in a stable state throughout the operation.

Instability of the electroless plating solution is ascribed to gradual separation of the catalyst from the plating surface and resultant accumulation thereof in the plating bath, entailing precipitation of metals from the wall and bottom surface of the plating tank. The present inventors found that such phenomenon can be controlled by incorporating the following two steps: treating the roughened adhesive layer surface on the insulating circuit board with an alkali solution and further treating the masked board (masked except for the portion where the circuit is to be formed) with a surfactant, and it was also found that these treatments lead to a marked improvement of copper utilization of the electroless plating solution. This invention is based on these findings.

Thus, the present invention provides a process for producing a printed circuit board comprising forming a plating film forming adhesive layer on the whole exposed surface of an insulating board, roughening said adhesive layer surface, depositing a catalyst for electroless plating on said adhesive layer surface from a catalyst solution, masking the entire surface of the board save the portion where the circuit is to be formed, and then forming the circuit by electroless plating, wherein the roughened adhesive layer surface is treated with an alkali solution before depositing the catalyst and the masked insulating board (masked except for the portion where the circuit is to be formed) is treated with an aqueous solution containing a surfactant before performing the electroless plating.

Incorporation of said proposed steps can far more restrain separation of the catalyst than when no surfactant is added in the plating bath, resulting in an unanticipated effect.

The present invention is now described in further detail.

Firstly, as for the insulating circuit board, there may be used ordinary phenolic laminates, epoxy laminates, ceramics and the like.

As regards the adhesive, those principally composed of synthetic rubber of phenolic resin generally employed in the additive processes are suited for this invention. The synthetic rubbers usable in this invention include nitrile rubber, butadiene rubber, isoprene rubber, etc., while the phenolic resins may be of resol type or novolac type. The plating film forming adhesive layer is formed on at least one whole exposed surface of an insulating board, as well as at least one whole exposed surface of each insulating boards, the surface forming the outermost layer of laminated printed boards.

The roughening solution used for the surface roughening may be of any known type commonly used for chemical roughening, such as chromic acid-sulfuric acid, bichromic acid-sulfuric acid, chromic acid-borofluoric acid, etc. Mechanical means such as sandblasting may be also employed for said roughening.

Throughholes can be provided after the formation of the adhesive layer but before the roughening of the adhesive layer.

The alkali solution used in this invention may be a caustic alkali solution, ammonia, an amine solution, etc., but usually a caustic alkali solution of sodium hydroxide or potassium hydroxide is used. The pH of the solution is above 11, preferably above 12, more preferably 13 to 14. The treatment is usually dipping and may be conducted at room temperature for a period of 2 to 10 minutes, but usually treatment for about 5 minutes is sufficient.

The activation treatment may be a usually practised treatment using an acidic stannous chloride solution or an acidic palladium chloride solution, or such treatment may be accomplished by using an activating solution containing stannous chloride, palladium chloride and hydrochloric acid.

As for the mask applied for preventing deposition of the plating film to the unnecessary part, or the part other than where the circuit is to be formed, it is preferable to use one principally composed of an epoxy resin for the reason of chemical resistance during the plating operation, but use of other substances is not inhibited.

The surfactant used in this invention after masking the board surface other than the circuit-forming part may be of any type, nonionic, anionic or cationic, and such surfactant is used in the form of an aqueous solution. Exemplary of such surfactants are polyethylene glycol alkyl ether, polyethylene glycol phosphoric acid ester, polyethylene glycol alkyl phenol ether, fatty acid salts, alkylbenzene sulfonate and the like. The treatment with an aqueous solution of a surfactant is accomplished by dipping the board in said aqueous solution at room temperature for 1 to 10 minutes.

For electroless plating in this invention, there may be used any known method capable of forming a plating film of copper or nickel. Usually copper plating is preferred. It is also preferable to conduct the electroless plating in a water-washed, wet state after the surfactant treatment, because drying of the board has a possibility to oxidize the catalyst, as well as such drying step can be omitted.

It is free to perform where necessary other ordinary treatments, for example, a usual acid treatment practised after the alkali treatment of this invention for prolonging the life of the activating solution or a similar hydrochloric acid treatment before plating, and these treatments do not impair the effect of this invention in whatever manner.

The treatments by said solutions according to this invention allow of suitable selection of means such as dipping, coating, spraying, etc., according to the purpose of use.

PREFERRED EMBODIMENTS OF THE INVENTION

The invention is further described hereinbelow by way of the embodiment thereof, but the invention is in no way limited by these embodiments.

EXAMPLE 1

A phenolic resin-modified nitrile rubber based thermosetting resin (commercially available from Sale Tilney (Japan) Ltd. under the trade name 777) was coated on one side of a paper phenolic laminate (commercially available from Hitachi Kasei Kogyo Co., under the trade name LP-43-N) by blow coating, and this was subjected to 80-minute heat curing at 160° C. Then, after forming throughholes at the necessary parts, said laminate was dipped in a chromium-sulfuric acid mixture (a mixture of 60 g of $CrO_3$ and 220 ml of concentrated sulfuric acid was added with water to make the total amount 1 liter) at 45° C. for 7 minutes to roughen said adhesive layer surface. This was followed by 5-minute washing with water at room temperature and further 5-minute dipping in an aqueous solution of hydrochloric acid (100 ml of 36% HCl was diluted with water so that the amount of the solution became 1 liter) to remove remaining chromium.

After additional 2-minute washing with water at room temperature, said laminate was subjected to an alkali treatment comprising 10-minute dipping in an aqueous sodium hydroxide solution (pH 13.0) at room temperature, followed by further 2-minute washing with water at room temperature, one-minute dipping in an aqueous hydrochloric acid solution (500 ml of 36% HCl solution was diluted with water to make the total amount of the solution 1 liter) and 10-minute dipping in a sensitizer containing stannous chloride and palladium chloride (commercially available from Hitachi Kasei Kogyo Co. under the trade name HS-101-B). After additional 2-minute washing with water at room temperature, the board was dipped in an aqueous solution containing hydrochloric acid and oxalic acid (a mixture of 100 ml of 36% HCl solution and 10 g of oxalic acid was diluted with water to a total solution amount of 1 liter) for 5 minutes and further washed with water for 2 minutes. The thus formed board was dried at 80° C. for 30 minutes and then a masking agent of the following composition was applied to the conductor circuit unnecessary portion by silk screen printing.

MASKING AGENT COMPOSITION

Epicoat 1007 (produced by Shell Chemical Co.): 65 parts
Epicoat 828 (produced by Shell Chemical Co.): 35 parts
Polyvinyl butyral resin (available from Sekisui Kagaku Co. under the trade name SLEC BL-2): 25 parts
Silicon oxide: 40 parts
Zirconium silicate: 40 parts
Phthalocyanine Green: 2 parts
Dicyandiamide: 5 parts
N,N,N',N'-tetramethylbutanediamine: 1.1 part
Sarcosine n-oleate: 1 part
Butylcarbitol: 40 parts
Methyl cellosolve: an amount enough to let the whole composition have a viscosity of 200 cps at 20° C.

Then the board was left in the atmospheric air at room temperature for one hour and then heated at 130° C. for 40 minutes to cure the mask resin. After cooling, the side of the board not applied with the adhesive was also silk screened with the resin of said composition, and after one-hour standing in the atmospheric air, the board was heat cured at 160° C. for one hour. Again after cooling, said board was dipped, at room temperature for 5 minutes, in a treating solution prepared by dissolving 2 g of a phosphoric acid ester based surfactant (available from Toho Chemicals under the trade name Gafac RE-610) in water to make the total amount 1 liter.

Then said board was washed with water and dipped in an electroless copper plating solution of the following composition at 72° C. for 8 hours to let copper separate out by a thickness of 28 μm only at the necessary portion to thereby prepare a one-side throughholed printed circuit board.

COPPER PLATING SOLUTION COMPOSITION $CuSO_4.5H_2O$: 10 g
Ethylenediaminetetraacetic acid: 30 g
37% formalin: 3 ml
Polyethylene glycol (average molecular weight 600): 20 g
2,2'-dipyridyl: 30 mg
NaOH: an amount necessary for adjusting pH to 12.4 (at 20° C.)
Water: an amount necessary for making the total amount 1 liter.

In the above-described way, electroless plating was repeated 5 times by using said copper plating solution. The average copper utilization in 5 repetitions of plating operation was over 92%.

Copper utilization is a value (%) obtained by dividing the weight of Cu precipitated at the circuit-forming portion by the sum of the weight of Cu precipitated on the plating tank wall and bottom and the weight of Cu precipitated at the circuit-forming portion, in 5 repetitions of plating operation with the same plating solution, and multiplying the product by 100.

EXAMPLE 2

The same process as Example 1 was repeated except that a treating solution containing a straight chain alkylbenzene based surfactant and a higher alcohol based anion surfactant (commercial name: Mama-lemon produced by Lion Yushi) was used instead of the phosphoric acid ester based surfactant (Gatac RE-610) to prepare a one-side throughholed printed circuit board. The copper utilization was 90%.

Comparative Example 1

The process of Example 1 was repeated excepting the alkali treatment and the treatment with a surfactant to prepare a one-side throughholed printed circuit board. The copper utilization was 45%.

Comparative Example 2

A one-side throughholed printed circuit board was made in the same way as Example 1 except that no alkali treatment was conducted. The copper utilization was 64%.

Comparative Example 3

A one-side throughholed printed circuit board was made in the same way as Example 1 except that no treatment with a surfactant was conducted. The copper utilization was 48%.

As apparent from the foregoing description, incorporation of a treatment with an alkali aqueous solution after roughening and a treatment with a surfactant after masking in the process of this invention can improve the copper utilization and can also realize stabilization of the plating bath.

What is claimed is:

1. A process for producing a printed circuit board comprising forming a plating film forming adhesive layer on the whole exposed surface of an insulating board, roughening the surface of said adhesive layer, depositing a catalyst for electroless plating on said adhesive layer surface from a catalyst solution, masking the board surface excepting the part where a circuit is to be formed, and forming a circuit on the board by electroless plating, wherein an improvement comprises a step of treating the roughened adhesive layer surface with an alkali aqueous solution before depositing the catalyst and a step of treating the insulating board, which has been masked excepting the part where a circuit is to be formed, with an aqueous solution containing a surfactant before conducting the electroless plating on said board, whereby stability of the electroless plating bath used in said electroless plating is maintained through repeated uses of said bath.

2. The process according to claim 1, wherein the alkali aqueous solution is an aqueous solution of a caustic alkali, ammonia or an amine.

3. The process according to claim 2, wherein the alkali aqueous solution is an aqueous solution of sodium hydroxide or potassium hydroxide.

4. The process according to claim 1, 2 or 3, wherein the roughened adhesive layer surface is treated by dipping it in an alkali aqueous solution with a pH above 11 at room temperature for 2 to 10 minutes.

5. The process according to claim 1, wherein the aqueous solution containing a surfactant is an aqueous solution of a nonionic, anionic or cationic surfactant.

6. The process according to claim 5, wherein the aqueous solution containing a surfactant is an aqueous solution of a polyethylene glycol alkyl ether, a polyethylene glycol phosphoric acid ester, a polyethylene glycol alkylphenol ether, a polyethylene glycol alkyl ether, a fatty acid salt or an alkylbenzene sulfonate.

7. The process according to claim 5 or 6, wherein the treatment by an aqueous solution of a surfactant is performed by dipping in an aqueous solution of a surfactant at room temperature for 1 to 10 minutes.

8. A process for producing a printed circuit board comprising forming a plating film forming adhesive layer on both whole exposed surfaces of an insulating board, roughening the surface of said adhesive layer, depositing a catalyst for electroless plating on said adhesive layer surface from a catalyst solution, masking the board surface excepting the part where a circuit is to be formed, and forming a circuit on the board by electroless plating, wherein an improvement comprises a step of providing throughholes after the formation of the adhesive layer but before the roughening of the adhesive layer, a step of treating the roughened adhesive layer surface with an alkali aqueous solution before depositing the catalyst and a step of treating the insulating board, which has been masked excepting the part where a circuit is to be formed, with an aqueous solution containing a surfactant before conducting the electroless plating on said board, whereby stability of the electroless plating bath used in said electroless plating is maintained through repeated uses of said bath.

9. A process for producing a printed circuit board comprising forming a plating film forming adhesive layer on at least one whole exposed surface of each insulating boards, the surface forming the outer most layer of laminated printed boards, roughening the surface of said adhesive layer, depositing a catalyst for electroless plating on said adhesive layer surface from a catalyst solution, masking the board surface excepting the part where a circuit is to be formed, and forming a circuit on the board by electroless plating, wherein an improvement comprises a step of treating the roughened adhesive layer surface with an alkali aqueous solution before depositing the catalyst and a step of treating the insulating board, which has been masked excepting the part where a circuit is to be formed, with an aqueous solution containing a surfactant before conducting the electroless plating on said board, whereby stability of the electroless plating bath used in said electroless plating is maintained through repeated uses of said bath.

10. A process for producing a printed circuit board comprising forming a plating film forming adhesive layer on the whole exposed surface of an insulating board, roughening the surface of said adhesive layer, depositing a catalyst for electroless plating on said adhesive layer surface from a catalyst solution, masking the board surface excepting the part where a circuit is to be formed, and forming a circuit on the board by electroless plating, wherein an improvement comprises a step of treating the roughened adhesive layer surface with an alkali aqueous solution before depositing the catalyst, a step of treating the insulating board, which has been masked excepting the part where a circuit is to be formed, with an aqueous solution containing a surfactant before conducting the electroless plating on said board, whereby stability of the electroless plating bath used in said electroless plating is maintained through repeated uses of said bath, and a step of conducting the electroless plating in a waterwashed, wet state after the surfactant treatment.

11. A process for producing a printed circuit board which comprises forming a plating film forming adhesive layer on the whole exposed surface of an insulating board, roughening the surface of said adhesive layer, treating the roughened adhesive layer surface with an alkali aqueous solution, depositing a catalyst for electroless plating on the roughened surface from a catalyst solution, masking the board surface excepting the part where a circuit is to be formed, treating the insulating board, which has been masked excepting the part where a circuit is to be formed, with an aqueous solution containing a surfactant and forming a circuit on the board by electroless plating, whereby, by the treating with an alkali aqueous solution and the treating with an aqueous solution containing a surfactant, stability of the electroless plating bath used for said electroless plating is maintained through repeated uses of said bath.

12. The process according to claim 1, wherein said alkali aqueous solution is an aqueous sodium hydroxide solution.

13. The process according to claim 12, wherein said aqueous sodium hydroxide solution has a pH of 13 to 14.

14. The process according to claim 12 or 13, wherein said aqueous solution containing a surfactant is an aqueous solution of a phosphoric acid ester based surfactant or an aqueous solution of a straight chain alkylbenzene based surfactant and a higher alcohol based anion surfactant.

15. The process according to claim 14, wherein said catalyst solution is a solution containing at least one of stannous chloride and palladium chloride.

16. The process according to claim 15, wherein said catalyst solution is a solution containing stannous chloride and palladium chloride.

17. The process according to claim 16, wherein said electroless plating is an electroless plating of nickel or copper.

18. The process according to claim 17, wherein said electroless plating is an electroless plating of copper.

19. The process according to claim 1, wherein the alkali aqueous solution has a pH of above 12.

20. The process according to claim 19, wherein the alkali aqueous solution has a pH of 13 to 14.

* * * * *